US007821007B2

(12) United States Patent
Choi

(10) Patent No.: US 7,821,007 B2
(45) Date of Patent: Oct. 26, 2010

(54) THIN FILM TRANSISTOR AND FLAT PANEL DISPLAY DEVICE

(75) Inventor: Jong-Hyun Choi, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 0 days.

(21) Appl. No.: 11/971,191

(22) Filed: Jan. 8, 2008

(65) Prior Publication Data

US 2008/0164477 A1 Jul. 10, 2008

(30) Foreign Application Priority Data

Jan. 9, 2007 (KR) ...................... 10-2007-0002594

(51) Int. Cl.
*H01L 29/76* (2006.01)
*H01L 31/036* (2006.01)
*H01L 31/112* (2006.01)

(52) U.S. Cl. .......................... 257/66; 257/408; 257/409

(58) Field of Classification Search ................... 257/66, 257/408, 409, 410, 411

See application file for complete search history.

(56) References Cited

U.S. PATENT DOCUMENTS 5,217,913 A * 6/1993 Watabe et al. ............... 438/304
5,608,251 A * 3/1997 Konuma et al. ............. 257/337
6,429,059 B2 * 8/2002 Yamazaki et al. ........... 438/158
6,559,906 B1 * 5/2003 Kawachi et al. ............... 349/47
6,777,763 B1 * 8/2004 Zhang et al. ................ 257/408
6,822,275 B2 * 11/2004 Harada et al. ............... 257/256
7,170,138 B2 * 1/2007 Takemura et al. ........... 257/408
7,417,252 B2 * 8/2008 Koo et al. ...................... 257/72
2002/0096681 A1 * 7/2002 Yamazaki et al. ............. 257/66
2005/0221568 A1 * 10/2005 Ishida et al. ................ 438/303
2006/0077163 A1 * 4/2006 Yanagi et al. ................. 345/94

FOREIGN PATENT DOCUMENTS

JP 2003-197638 7/2003

(Continued)

OTHER PUBLICATIONS

Uchikoga, et al., "Low temperature poly-Si TFT-LCD by excimer laser anneal," Thin Solid Films 383, 2001, pp. 19-24.

(Continued)

*Primary Examiner*—Phuc T Dang
(74) *Attorney, Agent, or Firm*—Christie, Parker & Hale, LLP

(57) ABSTRACT

A thin film transistor, a method of fabricating the same, and a flat panel display device including the same, are provided. According to the method, low resistance regions and high resistance regions can be manufactured through one doping process. The thin film transistor includes: a substrate; a semiconductor layer disposed on the substrate and including source and drain regions, high resistance regions smaller than the source and drain regions, a channel region, and connection regions disposed between the high resistance regions and the channel region; a gate insulating layer disposed on the semiconductor layer; a gate electrode disposed on the gate insulating layer above the channel region; an interlayer insulating layer disposed on the gate electrode; and source and drain electrodes disposed on the interlayer insulating layer and electrically connected to the source and drain regions, respectively.

19 Claims, 8 Drawing Sheets

FOREIGN PATENT DOCUMENTS

| | | |
|---|---|---|
| JP | 2003-257989 | 9/2003 |
| KR | 1996-0039436 | 11/1996 |
| KR | 1999-0057406 | 7/1999 |
| KR | 10-2004-0031563 | 4/2004 |
| KR | 10-2005-0031249 | 4/2005 |
| KR | 10-2005-0117128 | 12/2005 |
| KR | 10-2005-0117132 | 12/2005 |
| KR | 10-2006-0014671 | 2/2006 |

OTHER PUBLICATIONS

Korean Patent Abstracts, Publication No. 1020040031563 A, Published on Apr. 13, 2004, in the name of Jung, et al.

Korean Patent Abstracts, Publication No. 1020050031249 A, Published on Apr. 6, 2005, in the name of Hwang.

* cited by examiner

THIN FILM TRANSISTOR AND FLAT PANEL DISPLAY DEVICE

CROSS-REFERENCE TO RELATED APPLICATION

This application claims priority to and the benefit of Korean Patent Application No. 10-2007-0002594, filed in the Korean Intellectual Property Office on Jan. 9, 2007, the entire content of which is incorporated by reference for all purposes as if fully set forth herein.

BACKGROUND OF THE INVENTION

1. Field of the Invention

The present invention relates to a thin film transistor, a method of fabricating the same, and a flat panel display device including the same.

2. Description of the Related Art

A flat panel display device such as an organic light emitting display device or a liquid crystal display device includes N×M unit pixels disposed in a matrix format. The flat panel display device may be classified as a passive matrix type or an active matrix type according to the driving method of the N×M unit pixels. In the active matrix type flat panel display device, a unit pixel region includes a pixel electrode for defining an emission region and a unit pixel driving circuit for applying a current or voltage to the pixel electrode. The unit pixel driving circuit includes at least one thin film transistor.

Generally, such a thin film transistor includes a semiconductor layer, a gate electrode, and source and drain electrodes. Source and drain regions are formed at respective sides of the semiconductor layer, and a channel region is interposed between the source and drain regions. The semiconductor layer may be formed of polycrystalline silicon or amorphous silicon. However, since electron mobility of the polycrystalline silicon is higher than that of the amorphous silicon, the polycrystalline silicon is more widely used.

A thin film transistor formed of the polycrystalline silicon has a large off-current in comparison with a thin film transistor formed of the amorphous silicon. In order to solve the problem of the thin film transistor formed of the polycrystalline silicon having large off-current, a structure in which a lightly doped region is disposed between the source and drain regions, i.e., heavily doped regions, and the channel region of the thin film transistor formed of the polycrystalline silicon, namely, a lightly doped drain (LDD) structure, has been proposed. The LDD region is effective to suppress a hot carrier effect (HCE) that is one of short channel effects (SCE). The hot carrier effect means that reduction of the channel length of the thin film transistor causes carriers having high energy, i.e., hot carriers, to occur by an electric field abruptly increased between the drain region and the channel region on driving the thin film transistor. The hot carriers may be injected into a gate insulating layer to damage the gate insulating layer, and cause a trap in the gate insulating layer, thereby deteriorating the thin film transistor. Therefore, the LDD regions are formed between the channel region and the source and drain regions to prevent the electric field from abruptly increasing, thereby preventing generation of the hot carriers. In addition, as the concentration of impurities in the LDD region is lowered, the hot carrier effect is further suppressed.

FIG. 1 is a cross-sectional view of a conventional thin film transistor.

Referring to FIG. 1, a buffer layer 110 is formed on a substrate 100, and an amorphous silicon layer is formed on the buffer layer 110. The amorphous silicon layer is crystallized to form a polycrystalline silicon layer, and then patterned to form a semiconductor layer 120. In addition, a channel doping process is performed on the semiconductor layer 120.

Then, a gate insulating layer 130 is formed on the entire surface of the substrate including the semiconductor layer 120, and a gate electrode material is formed on the gate insulating layer 130. Next, the gate electrode material is patterned to form a gate electrode 140 using an etching mask.

An ion doping process is performed using the etching mask disposed on the gate electrode 140 as an ion implantation mask to form lightly doped drain (LDD) regions 122. At this time, a region between the LDD regions 122 in the semiconductor layer 120 is referred to as a channel region 123.

A photoresist pattern is disposed on the gate insulating layer 130 and the gate electrode 140 corresponding to portions of the LDD regions 122 adjacent to the channel region 123, and then an ion doping process is performed using the photoresist pattern as a mask, thereby forming source and drain regions 121. As a result, the semiconductor layer 120 including the source and drain regions 121, the LDD regions 122, and the channel region 123 is completed.

An interlayer insulating layer 150 is formed on the entire surface of the substrate including the gate electrode 140. The interlayer insulating layer 150 is etched to form contact holes 150*a* to expose the source and drain regions 121.

Source and drain electrodes 160 connected, respectively, to the source and drain regions 121 through the respective contact holes 150*a* are formed. As a result, the thin film transistor including the semiconductor layer, the gate electrode, and the source and drain electrodes is completed.

However, in order to form the LDD regions and the source and drain regions in the semiconductor layer of the conventional thin film transistor, the ion doping process is performed twice using two masks. As a result, manufacturing cost is increased, processes are complicated, and productivity is decreased due to the complicated processes.

SUMMARY OF THE INVENTION

In exemplary embodiments according to the present invention, a thin film transistor, a method of fabricating the same, and a flat panel display device including the same, are provided. Using a method of fabrication according to the exemplary embodiments, source and drain regions and high resistance regions are formed through one doping process. This way, a manufacturing process is simplified, and manufacturing cost is reduced.

According to an aspect of an exemplary embodiment of the present invention, a thin film transistor includes: a substrate; a semiconductor layer on the substrate and including source and drain regions, high resistance regions smaller than the source and drain regions, a channel region, and connection regions between respective said high resistance regions and the channel region; a gate insulating layer on the semiconductor layer; a gate electrode on the gate insulating layer above the channel region; an interlayer insulating layer on the gate electrode; and source and drain electrodes on the interlayer insulating layer and electrically connected to the source and drain regions, respectively.

According to another aspect of an exemplary embodiment of the present invention, a method of fabricating a thin film transistor includes: forming a polycrystalline silicon layer on a substrate; patterning the polycrystalline silicon layer to form a semiconductor layer; forming a gate insulating layer on the entire surface of the substrate including the semiconductor layer; forming a gate electrode on the gate insulating layer above the channel region; performing an ion doping process on the semiconductor layer to form source and drain regions, high resistance regions, connection regions, and a channel region; forming an interlayer insulating layer on the entire surface of the substrate including the gate electrode; and forming source and drain electrodes connected, respectively, to the source and drain regions on the interlayer insulating layer.

According to still another aspect of an exemplary embodiment of the present invention, a flat panel display device includes: a substrate; a semiconductor layer on the substrate and including source and drain regions, high resistance regions smaller than the source and drain regions, a channel region, and connection regions between respective said high resistance regions and the channel region; a gate insulating layer on the semiconductor layer; a gate electrode on the gate insulating layer above the channel region; an interlayer insulating layer on the gate electrode; source and drain electrodes on the interlayer insulating layer and electrically connected to the source and drain regions, respectively; and a display element coupled with the source electrode or the drain electrode, wherein the display element is adapted to display an image in accordance with voltages applied at the gate electrode and the source and drain electrodes.

BRIEF DESCRIPTION OF THE DRAWINGS

The above and other features of the present invention will be described in reference to certain exemplary embodiments thereof with reference to the attached drawings in which.

DETAILED DESCRIPTION

The present invention will now be described more fully hereinafter with reference to the accompanying drawings, in which exemplary embodiments of the invention are shown.

Figure 1:
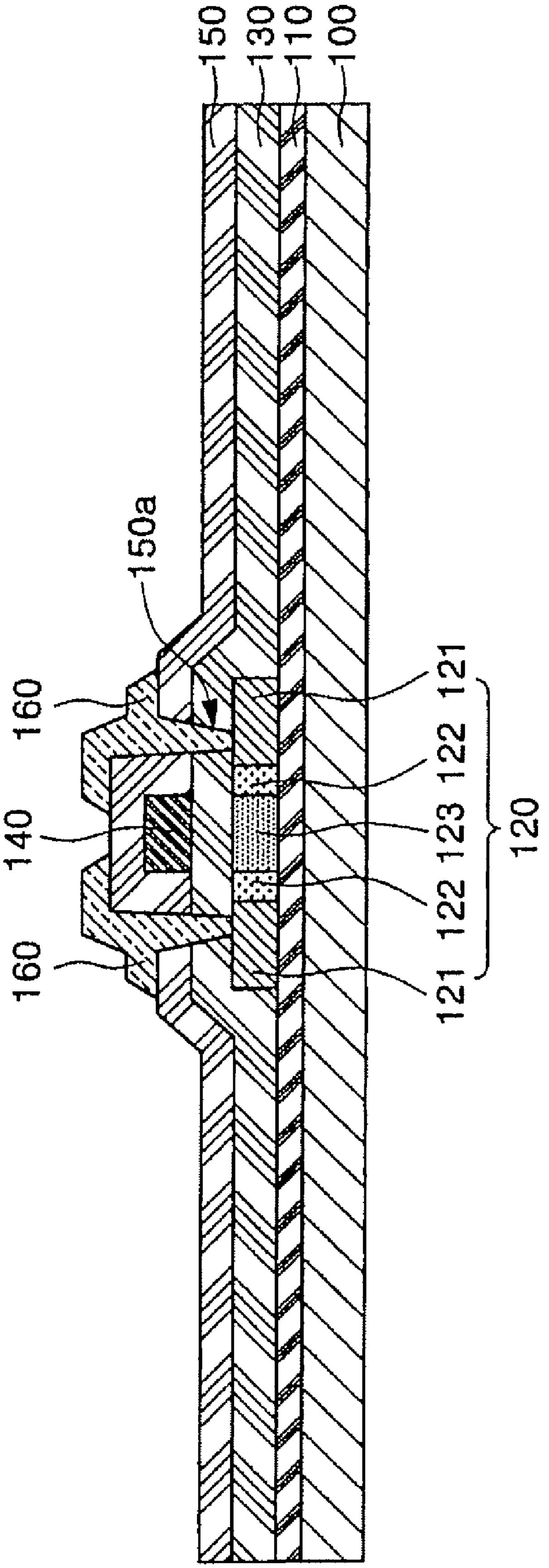
FIG. 1 is a cross-sectional view of a conventional thin film transistor.
Figure 2:
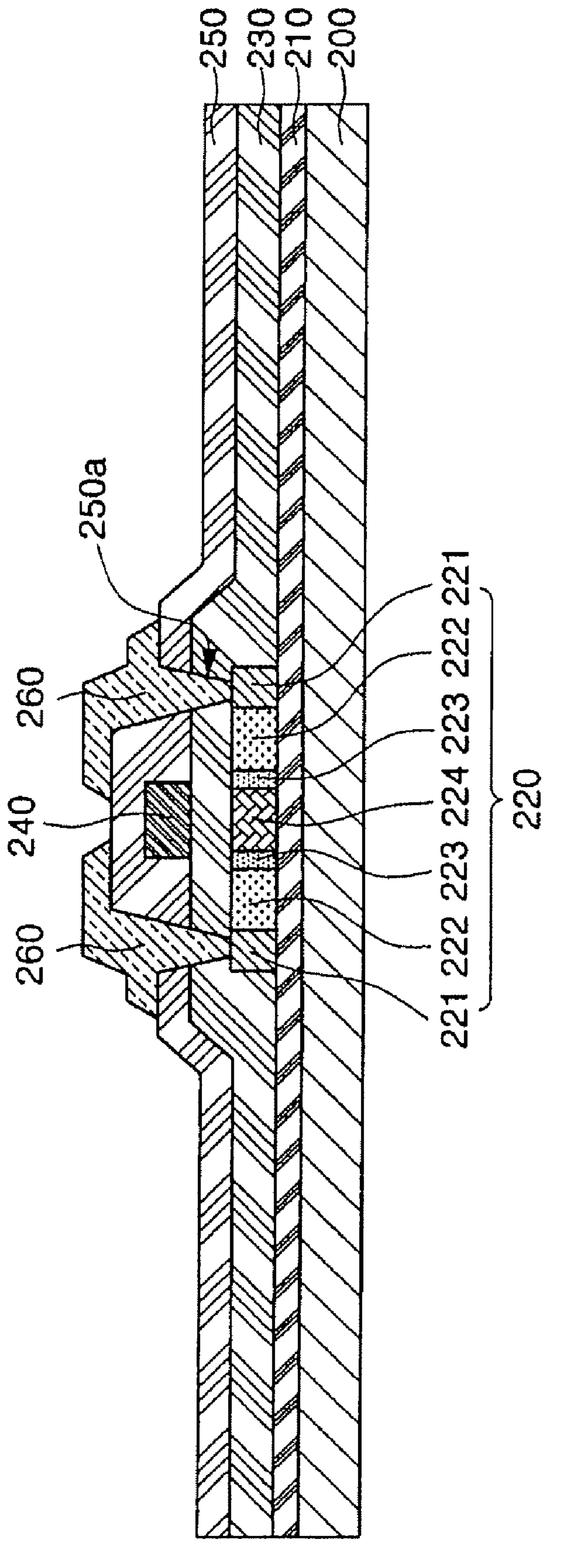
FIG. 2 is a cross-sectional view of a thin film transistor in accordance with an exemplary embodiment of the present invention.

FIG. 2 is a cross-sectional view of a thin film transistor in accordance with an exemplary embodiment of the present invention.

Referring to FIG. 2, a buffer layer 210 is formed on a substrate 200 formed of glass, stainless steel or plastic. The buffer layer 210 may be formed of a silicon nitride layer, a silicon oxide layer, or a combination thereof. The buffer layer 210 prevents diffusion of moisture or impurities generated from a lower substrate or adjust a thermal transfer rate during crystallization to facilitate crystallization of a semiconductor layer 220 to be formed through the following process.

Then, the semiconductor layer 220 including source and drain regions 221, high resistance regions 222, a channel region 224, and connection regions 223 is formed on the buffer layer 210.

The high resistance regions 222 may have a size smaller than that of the source and drain regions 221. The source and drain regions 221 have a resistance of 1-3 kΩ/cm$^3$, and the high resistance regions 222 have a resistance of 100 kΩ/cm$^3$. Here, the small size refers to the fact that the high resistance regions 222 have a length larger and a width smaller than that of the source and drain regions 221.

The high resistance regions 222 may have a length 1.3-10 times larger than that of the source and drain regions 221. In addition, the high resistance regions 222 may have a 25-100% width of the source and drain regions 221. In one embodiment, the high resistance regions 222 have a width that is 50% of that of the source and drain regions 221. When the high resistance regions 222 satisfy the above conditions, even though the same amount of impurities are injected into the source and drain regions 221 and the high resistance region 222, it is possible to perform the same function as the conventional LDD region, i.e., prevent generation of hot carriers by blocking abrupt increase of an electric field. Therefore, leakage current is reduced, and device reliability is improved. In addition, since the number of masks used in the ion doping process is reduced, and the source and drain regions 221 and the high resistance region 222 can be formed by one doping process, it is possible to reduce manufacturing cost and simplify a manufacturing process.

Here, the high resistance regions 222 may have a length of 3-20 μm, and a width of 1-4 μm. When the high resistance regions 222 satisfy the above conditions, even though the same amount of impurities are injected into the source and drain regions 221 and the high resistance regions 222, it is possible for the high resistance regions 222 to perform the same function as the conventional LDD regions, i.e., prevent generation of hot carriers by blocking abrupt increase of an electric field. Therefore, leakage current is reduced, and device reliability is improved. In addition, since the number of masks used in the ion doping process is reduced, and the source and drain regions 221 and the high resistance regions 222 can be formed by one doping process, it is possible to reduce manufacturing cost and simplify manufacturing process.

The high resistance regions 222 may have a rectangular or zigzag shape, but is not limited thereto. By way of example, when the high resistance region 222 has a zigzag shape, it is possible to maximally increase the length in the same area, thereby providing a relatively high resistance in the same area.

The connection regions 223 are disposed between the channel region 224 and the respective high resistance regions 222, and have a 5-50% area of the channel region 224. When the connection regions 223 satisfy the above condition, the connection regions 223 may be utilized as a space for obtaining a process margin when a gate electrode is formed by the following process, and thus yield of the device can be remarkably increased. In addition, the shape of the connection regions 223 is not limited and, at least one surface of the connection regions 223 may have a taper angle or a curved surface, e.g., a quarter-circular shape, a semi-circular shape, a circular shape, or an oval shape.

Then, a gate insulating layer 230 formed of a silicon oxide layer, a silicon nitride layer, or a combination thereof is formed on the semiconductor layer 220, and a gate electrode 240 is formed on a region of the gate insulating layer 230 corresponding to the channel region 224. In other words, the gate electrode 240 is formed on the gate insulating layer 230 at a location directly above the channel region 224. In this process, the gate electrode 240 may be formed of one selected from Al, an Al-alloy, Mo or a Mo alloy. In one embodiment, the gate electrode is formed of MoW.

Next, an interlayer insulating layer 250 is formed on the entire surface of the substrate including the gate electrode 240. The interlayer insulating layer 250 may be formed of a silicon oxide layer, a silicon nitride layer, or a combination thereof.

The interlayer insulating layer 250 is etched to form contact holes 250*a*, and source and drain electrodes 260 connected to the source and drain regions 221 through the contact holes 250*a* are formed. The source and drain electrodes 260 may be formed of one selected from the group consisting of Mo, W, MoW, $WSi_2$, $MoSi_2$, and Al.

As a result, the thin film transistor in accordance with an exemplary embodiment of the present invention is completed.

Hereinafter, a method of fabricating a thin film transistor in accordance with an exemplary embodiment of the present invention will be described.

A substrate 200 is provided, and a buffer layer 210 is formed on the substrate 200 using a chemical vapor deposition method or a physical vapor deposition method.

An amorphous silicon layer is formed on the buffer layer 210, and then crystallized to form a polycrystalline silicon layer or a single crystalline silicon layer. The amorphous silicon layer may be formed by a chemical vapor deposition method or a physical vapor deposition method. In addition, at the time of forming the amorphous silicon layer or after forming the amorphous silicon layer, a process of dehydrogenating the layer to lower the concentration of hydrogen may be performed. Further, crystallizing the amorphous silicon layer may be performed using at least one of a rapid thermal annealing (RTA) method, a solid phase crystallization (SPC) method, a metal induced crystallization (MIC) method, a metal induced lateral crystallization (MILC) method, a super grained silicon (SGS) method, an excimer laser crystallization (ELA) method, or a sequential lateral solidification (SLS) method.

The polycrystalline silicon layer is patterned to form source and drain regions, high resistance regions, connection regions, and a channel region, which are to be formed later. In this process, the patterned polycrystalline silicon layer may be subjected to a channel doping process.

A gate insulating layer 230 is formed on the entire surface of the substrate including the patterned polycrystalline silicon layer. A gate electrode 240 is formed on a region of the gate insulating layer 230 corresponding to the channel region (i.e., on the gate insulating layer 230 and directly above the channel region), or the channel region and the connection regions (i.e., on the gate insulating layer 230 and directly above the channel region and the connection regions).

Then, a mask is positioned on the gate electrode 240, and an ion doping process of implanting impurities into the patterned polycrystalline silicon layer is performed to complete a semiconductor layer 220 including the source and drain regions 221, the high resistance regions 222, the connection regions 223, and the channel region 224. Concentration of the impurities implanted during the ion doping process may be 5xE14-1xE16 atoms/$cm^3$. In one exemplary embodiment, the concentration of impurities is 5xE14-5xE15 atoms/$cm^3$.

Next, the mask positioned on the gate electrode 240 is removed, and an interlayer insulating layer 250 is formed on the entire surface of the substrate including the gate electrode 240 using a chemical vapor deposition method or a physical vapor deposition method.

In one embodiment, the interlayer insulating layer 250 is dry etched to form contact holes 250*a*, and source and drain electrodes 260 connected to the source and drain regions 221 through the contact holes 250*a* are formed by a sputtering process.

As a result, the thin film transistor in accordance with an exemplary embodiment of the present invention is completed.

Figure 3:
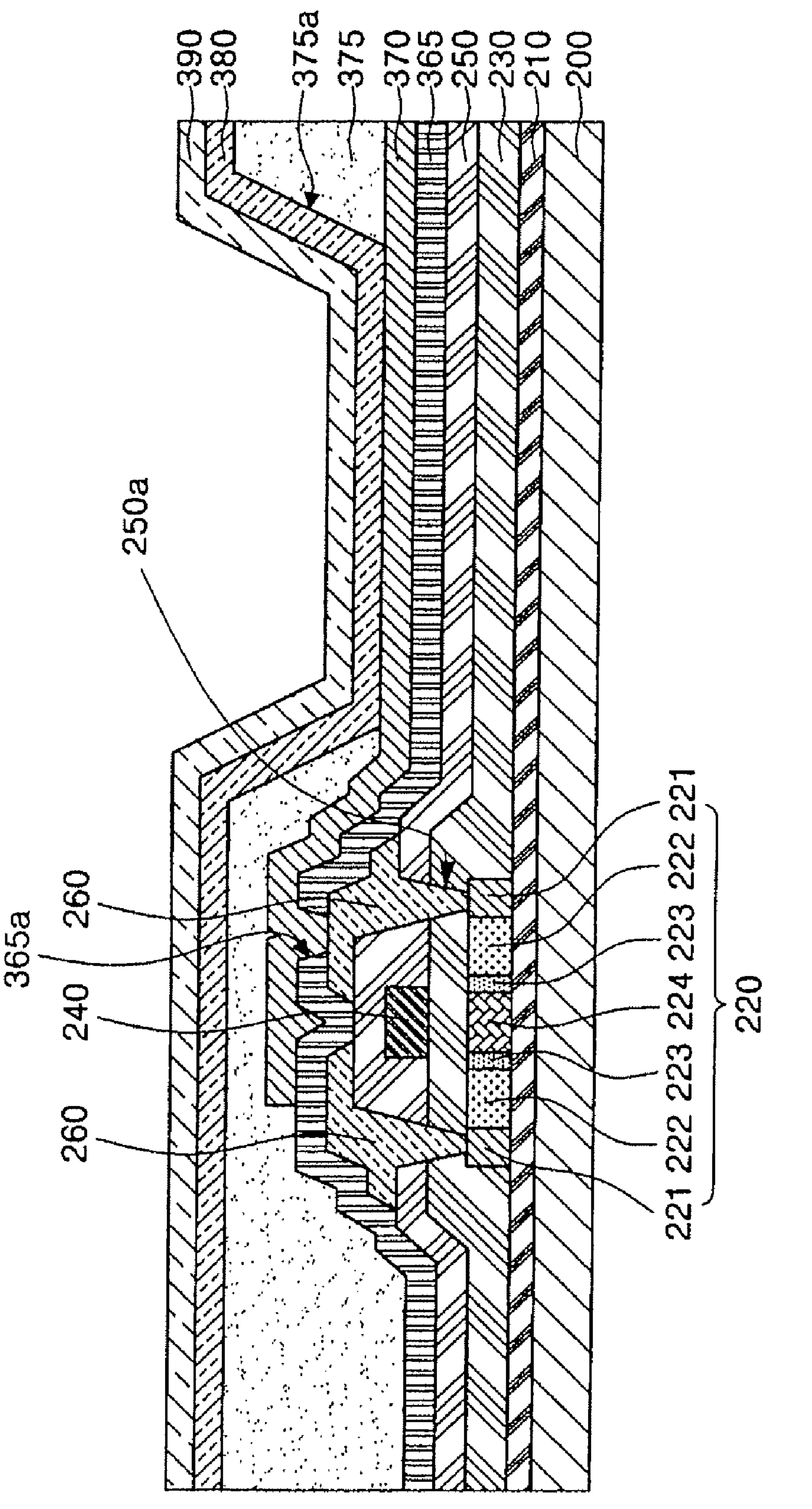
FIG. 3 is a partial cross-sectional view of a flat panel display device including a thin film transistor in accordance with an exemplary embodiment of the present invention.

FIG. 3 is a partial cross-sectional view of a flat panel display device including a thin film transistor in accordance with an exemplary embodiment of the present invention.

Referring to FIG. 3, a substrate 200 is provided, and a buffer layer 210 is formed on the substrate 200. A semiconductor layer 220 including source and drain regions 221, high resistance regions 222, connection regions 223, and a channel region 224 is formed on the buffer layer 210.

A gate insulating layer 230 is formed on the entire surface of the substrate 200 including the semiconductor layer 220. A gate electrode 240 is formed on a region of the gate insulating layer 230 corresponding to the channel region 224 (i.e., on the gate insulating layer 230 and directly above the channel region), or the channel region 224 and the connection regions 223 (i.e., on the gate insulating layer 230 and directly above the channel region and the connection regions).

An interlayer insulating layer 250 is formed on the entire surface of the substrate 200 including the gate electrode 240. The interlayer insulating layer 250 is etched to form contact holes 250*a* to expose the source and drain regions 221. Source and drain electrodes 260 respectively connected to the source and drain regions 221 through the respective contact holes 250*a* are formed.

A passivation layer 365 is formed on the entire surface of the substrate 200 including the source and drain electrodes 260. The passivation layer 365 is formed of a silicon nitride layer, a silicon oxide layer, or a combination thereof. The passivation layer 365 is etched to form a via-hole 365*a* to expose the source and drain electrodes 260.

A first electrode 370 connected to the source and drain electrodes 260 through the via-hole 365*a* is formed. The first electrode 370 may be formed of one of indium tin oxide (ITO), indium zinc oxide (IZO), or indium zinc tin oxide (IZTO), which have a high work function. While not shown, when the flat panel display device is a liquid crystal display device, an alignment layer may be formed on the substrate including the first electrode 370.

A pixel-defining layer 375 is formed on the entire surface of the substrate including the first electrode 370, and then patterned to form an opening 375*a* to expose a portion of the first electrode 370.

An organic layer 380 including an emission layer is formed on the first electrode 370. The organic layer 380 may further include at least one selected from a hole injection layer, a hole transport layer, a hole blocking layer, an electron transport layer, or an electron injection layer. The organic layer 380 may be formed by one selected from a vacuum deposition method, an inkjet printing method, or a laser induced thermal imaging method. While not shown, when the flat panel display device is a liquid crystal display device, a liquid crystal layer may be formed instead of the organic layer 380. Further, when the flat panel display device is the liquid crystal display device, the pixel-defining layer 375 is not formed. The organic layer 380 or the liquid crystal layer, that corresponds to one or more pixels or sub-pixels, may be referred to as a display element or a component of a display element. The display element is adapted to display an image in accordance with voltages applied to the gate electrode 240 and the source and drain electrodes 260.

Then, a second electrode layer 390 is formed on the organic layer 380. The second electrode 390 may be formed of Mg, Ag, Al, Ca, or an alloy thereof, which has a low work function.

While not shown, when the flat panel display device is a liquid crystal display device, an alignment layer may be further disposed between the second electrode and a liquid crystal layer.

As a result, the flat panel display device including a thin film transistor in accordance with an exemplary embodiment of the present invention is completed.

FIGS. 4A, 4B, 4C and 4D are plan views illustrating shapes of a semiconductor layer in accordance with exemplary embodiments of the present invention. Semiconductor layers 1220, 2220, 3220 and 4220 shown on FIGS. 4A, 4B, 4C and 4D, respectively, have a similar structure including a channel region, high resistance regions, connection regions, and source and drain regions, and function as the semiconductor layer 220 of FIGS. 2 and 3, and can be used as the semiconductor layer 220.

Figure 4A:
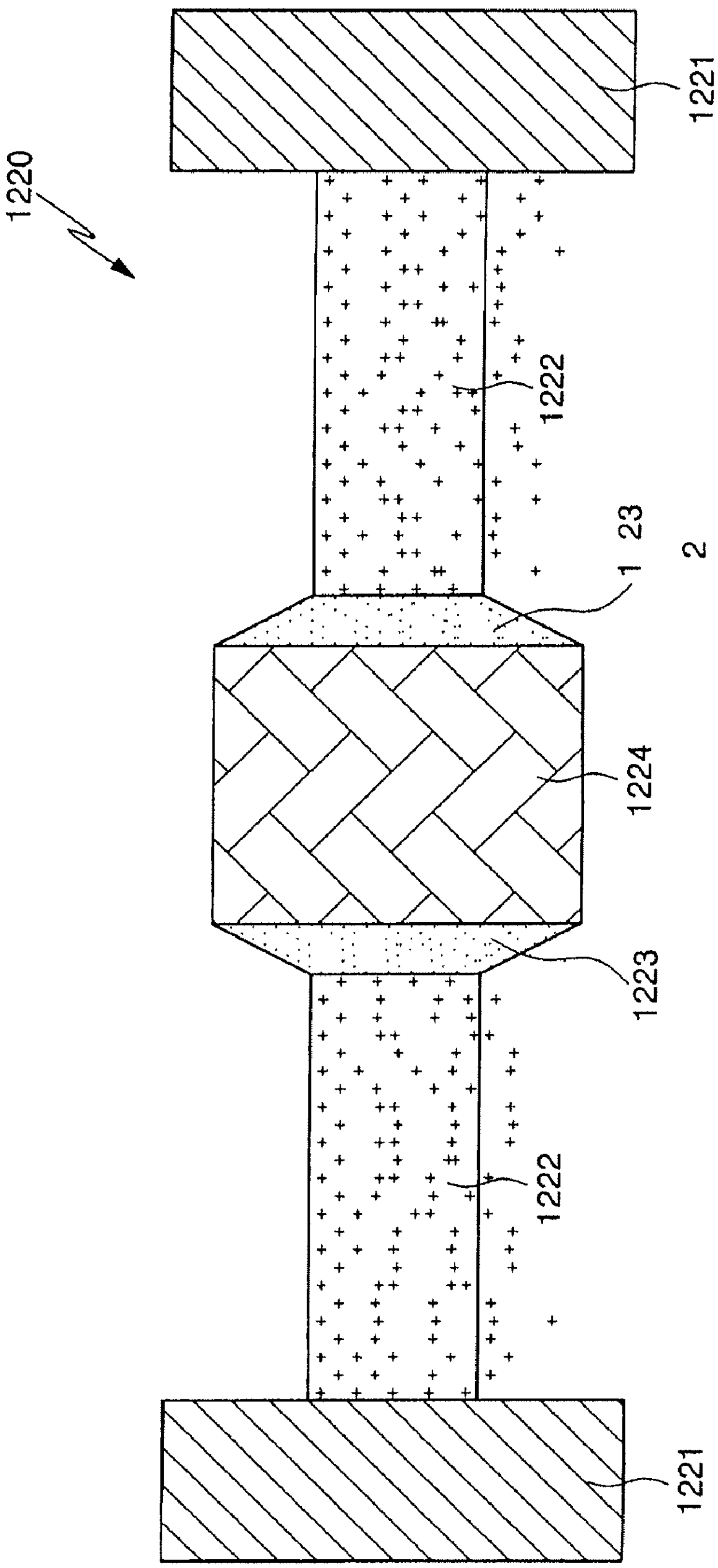
FIGS. 4A, 4B, 4C and 4D are plan views illustrating shapes of a semiconductor layer in accordance with exemplary embodiments of the present invention.

Referring to FIG. 4A, high resistance regions 1222 at respective sides of a channel region 1224 of the semiconductor layer 1220 have a rectangular shape, and connection regions 1223 have a trapezoidal shape. While source and drain regions 1221 are shown to have a rectangular shape, the source and drain regions 1221 may have a square shape. In addition, the high resistance regions 1222 have a smaller width and a larger length than those of the source and drain regions 1221.

Figure 4B:
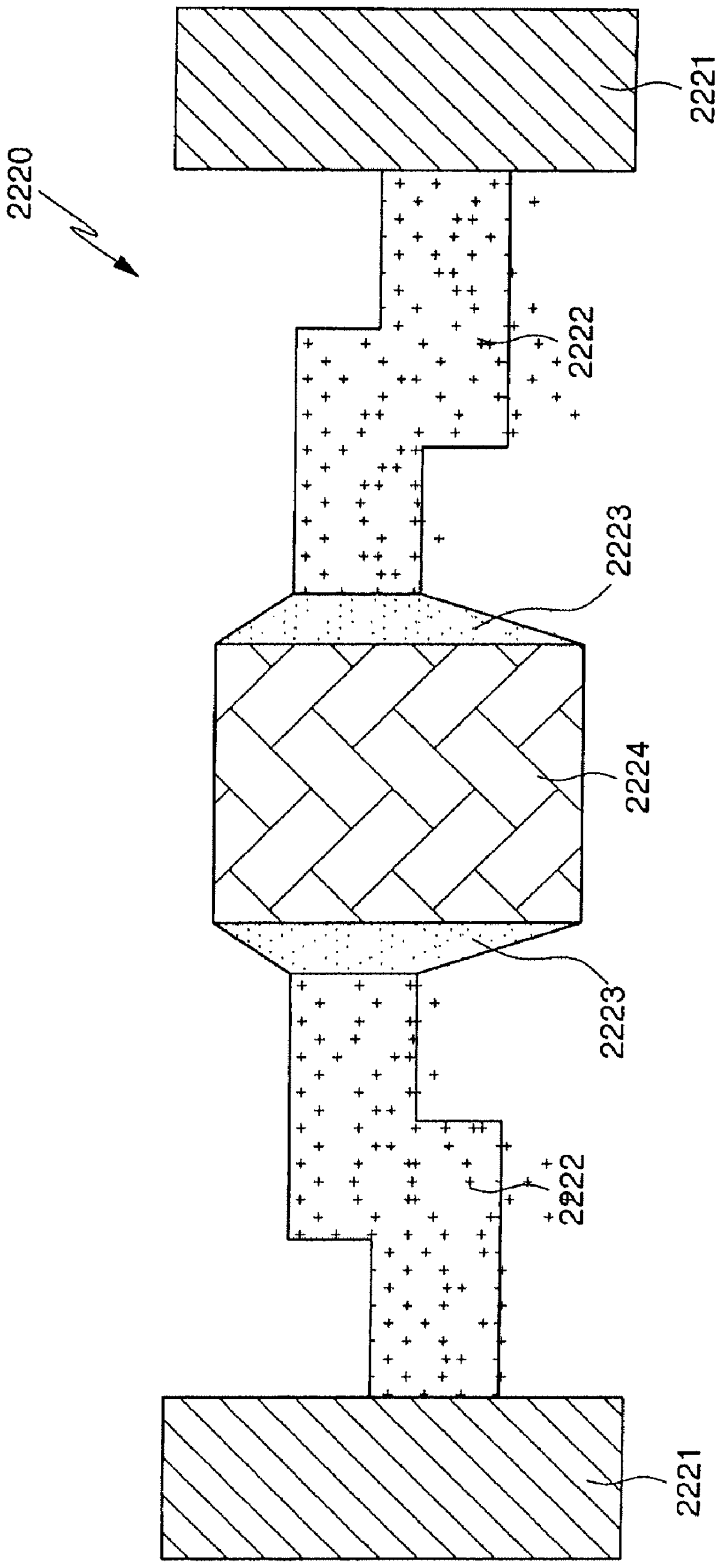

Referring to FIG. 4B, high resistance regions 2222 at respective sides of a channel region 2224 of the semiconductor layer 2220 have a zigzag shape, and connection regions 2223 each have opposite surfaces with tapered angles that are different from each other. While source and drain regions 2221 are shown to have a rectangular shape, the source and drain regions 2221 may have a square shape. In addition, the high resistance regions 2222 have a smaller width and a larger length than those of the source and drain regions 2221.

Figure 4C:
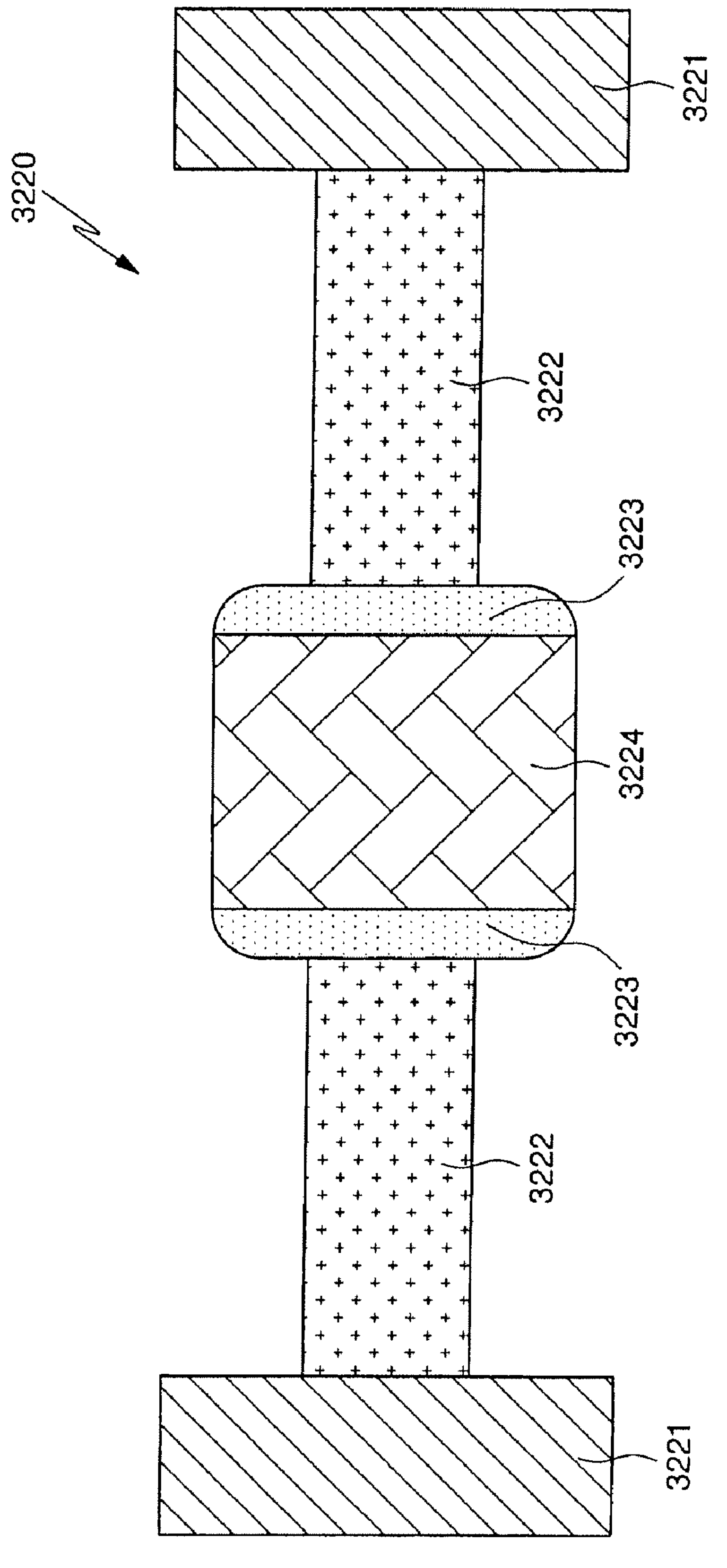

Referring to FIG. 4C, high resistance regions 3222 of the semiconductor layer 3220 have a rectangular shape, and connection regions 3223 each have a trapezoidal shape having two opposite curved surfaces. While source and drain regions 3221 are shown to have a rectangular shape, the source and drain regions 3221 may have a square shape. In addition, while the connection regions 3223 are shown to have a quarter-circular shape, the connection regions 3223 may have an oval shape or a semi-circular shape. Further, the high resistance regions 3222 have a smaller width and a larger length than those of the source and drain regions 3221.

Figure 4D:
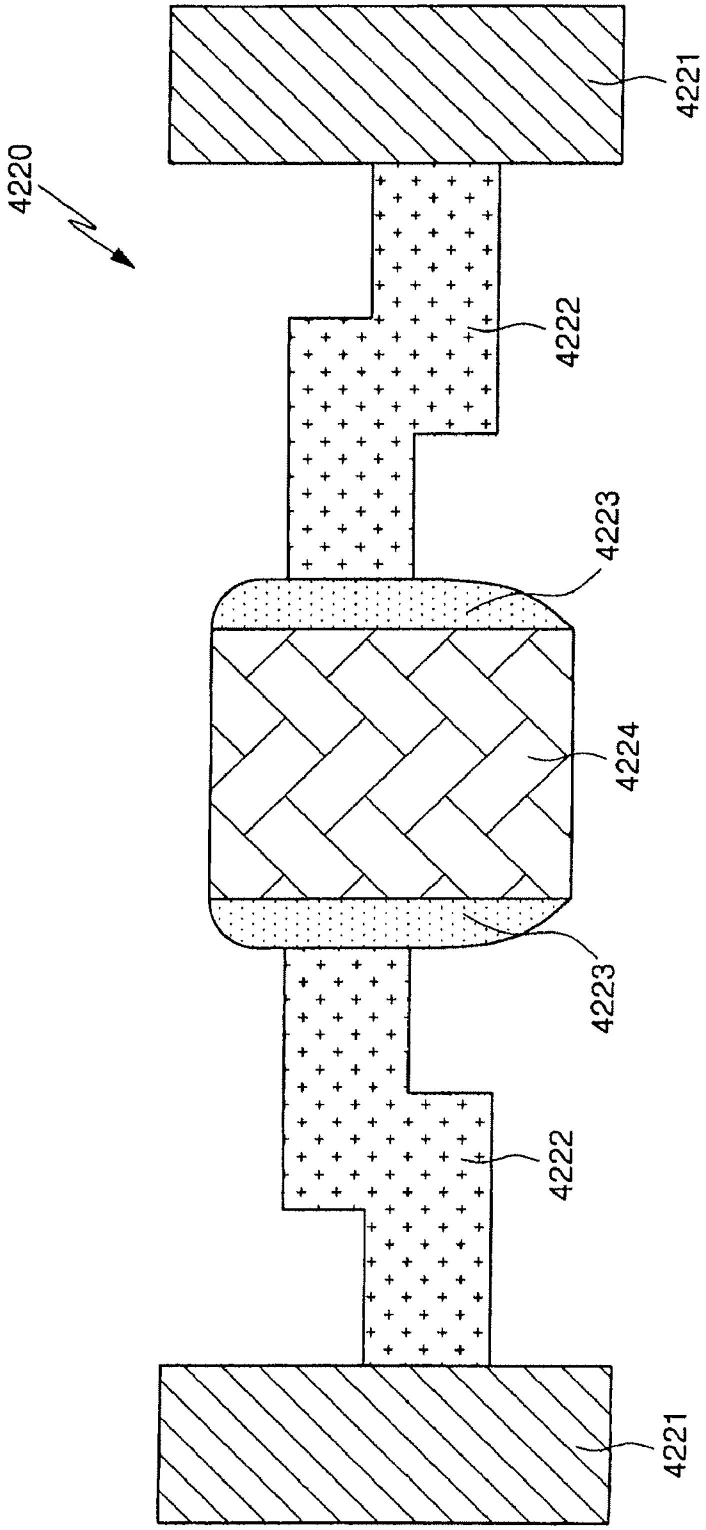

Referring to FIG. 4D, high resistance regions 4222 of the semiconductor layer 4220 have a zigzag shape, and connection regions 4223 each have a trapezoidal shape having two opposite curved surfaces. While source and drain regions 4221 are shown to have a rectangular shape, the source and drain regions 4221 may have a square shaped. In addition, while the connection regions 4223 are shown to have a quarter-circular shape, the connection regions 4223 may have an oval shape or a semi-circular shape. Further, the high resistance regions 4222 have a smaller width and a larger length than those of the source and drain regions 4221.

Hereinafter, the present invention will be described with reference to the following exemplary embodiments. However, the present invention is not be limited thereto.

Exemplary Embodiment 1

A silicon nitride layer having a thickness of 4000 Å (0.4 μm) was formed on a substrate as a buffer layer, and a semiconductor layer having a thickness of 500 Å (0.05 μm) and including high resistance regions having a width of 2 μm and a length of 5 μm, source and drain regions having a width of 4 μm and a length of 4 μm, a channel region having a width of 4 μm and a length of 0.5 μm, and connection regions having a width of 4 μm and a length of 0.1 μm, was formed on the buffer layer. A silicon nitride layer having a thickness of 1200 Å (0.12 μm) was formed on the semiconductor layer as a gate insulating layer, and molybdenum having a thickness of 2000 Å (0.2 μm) was formed on the gate insulating layer as a gate electrode. A silicon nitride layer having a thickness of 1500 Å (0.15 μm) was formed on the entire surface of the substrate including the gate electrode as an interlayer insulating layer, and aluminum having a thickness of 1000 Å (0.1 μm) was formed on the interlayer insulating layer as source and drain electrodes respectively connected to the source and drain regions.

Exemplary Embodiment 2

A silicon nitride layer having a thickness of 4000 Å (0.4 μm) was formed on a substrate as a buffer layer, and a semiconductor layer having a thickness of 500 Å (0.05 μm) and including high resistance regions having a width of 2 μm and a length of 7 μm, source and drain regions having a width of 4 μm and a length of 4 μm, a channel region having a width of 4 μm and a length of 0.5 μm, and connection regions having a width of 4 μm and a length of 0.1 μm, was formed on the buffer layer. A silicon nitride layer having a thickness of 1200 Å (0.12 μm) was formed on the semiconductor layer as a gate insulating layer, and molybdenum having a thickness of 2000 Å (0.2 μm) was formed on the gate insulating layer as a gate electrode. A silicon nitride layer having a thickness of 1500 Å (0.15 μm) was formed on the entire surface of the substrate including the gate electrode as an interlayer insulating layer, and aluminum having a thickness of 1000 Å (0.1 μm) was formed on the interlayer insulating layer as source and drain electrodes respectively connected to the source and drain regions.

Exemplary Embodiment 3

A silicon nitride layer having a thickness of 4000 Å (0.4 μm) was formed on a substrate as a buffer layer, and a semiconductor layer having a thickness of 500 Å (0.05 μm) and including high resistance regions having a width of 2 μm and a length of 9 μm, source and drain regions having a width of 4 μm and a length of 4 μm, a channel region having a width of 4 μm and a length of 0.5 μm, and connection regions having a width of 4 μm and a length of 0.1 μm, was formed on the buffer layer. A silicon nitride layer having a thickness of 1200 Å (0.12 μm) was formed on the semiconductor layer as a gate insulating layer, and molybdenum having a thickness of 2000 Å (0.2 μm) was formed on the gate insulating layer as a gate electrode. A silicon nitride layer having a thickness of 1500 Å (0.15 μm) was formed on the entire surface of the substrate including the gate electrode as an interlayer insulating layer, and aluminum having a thickness of 1000 Å (0.1 μm) was formed on the interlayer insulating layer as source and drain electrodes respectively connected to the source and drain regions.

Exemplary Embodiment 4

A silicon nitride layer having a thickness of 4000 Å (0.4 μm) was formed on a substrate as a buffer layer, and a semiconductor layer having a thickness of 500 Å (0.05 μm) and including high resistance regions having a width of 2 μm and a length of 11 μm, source and drain regions having a width of 4 μm and a length of 4 μm, a channel region having a width of 4 μm and a length of 0.5 μm, and connection regions having a width of 4 μm and a length of 0.1 μm, was formed on the buffer layer. A silicon nitride layer having a thickness of 1200 Å (0.12 μm) was formed on the semiconductor layer as a gate insulating layer, and molybdenum having a thickness of 2000 Å (0.2 μm) was formed on the gate insulating layer as a gate electrode. A silicon nitride layer having a thickness of 1500 Å (0.15 μm) was formed on the entire surface of the substrate including the gate electrode as an interlayer insulating layer, and aluminum having a thickness of 1000 Å (0.1 μm) was formed on the interlayer insulating layer as source and drain electrodes respectively connected to the source and drain regions.

Exemplary Embodiment 5

A silicon nitride layer having a thickness of 4000 Å (0.4 μm) was formed on a substrate as a buffer layer, and a semiconductor layer having a thickness of 500 Å (0.05 μm) and including high resistance regions having a width of 2 μm and a length of 13 μm, source and drain regions having a width of 4 μm and a length of 4 μm, a channel region having a width of 4 μm and a length of 0.5 μm, and connection regions having a width of 4 μm and a length of 0.1 μm, was formed on the buffer layer. A silicon nitride layer having a thickness of 1200 Å (0.12 μm) was formed on the semiconductor layer as a gate insulating layer, and molybdenum having a thickness of 2000 Å (0.2 μm) was formed on the gate insulating layer as a gate electrode. A silicon nitride layer having a thickness of 1500 Å (0.15 μm) was formed on the entire surface of the substrate including the gate electrode as an interlayer insulating layer, and aluminum having a thickness of 1000 Å (0.1 μm) was formed on the interlayer insulating layer as source and drain electrodes respectively connected to the source and drain regions.

Exemplary Embodiment 6

A silicon nitride layer having a thickness of 4000 Å (0.4 μm) was formed on a substrate as a buffer layer, and a semiconductor layer having a thickness of 500 Å (0.05 μm) and including high resistance regions having a width of 2 μm and a length of 15 μm, source and drain regions having a width of 4 μm and a length of 4 μm, a channel region having a width of 4 μm and a length of 0.5 μm, and connection regions having a width of 4 μm and a length of 0.1 μm, was formed on the buffer layer. A silicon nitride layer having a thickness of 1200 Å (0.12 μm) was formed on the semiconductor layer as a gate insulating layer, and molybdenum having a thickness of 2000 Å (0.2 μm) was formed on the gate insulating layer as a gate electrode. A silicon nitride layer having a thickness of 1500 Å (0.15 μm) was formed on the entire surface of the substrate including the gate electrode as an interlayer insulating layer, and aluminum having a thickness of 1000 Å (0.1 μm) was formed on the interlayer insulating layer as source and drain electrodes respectively connected to the source and drain regions.

Comparative Example 1

A silicon nitride layer having a thickness of 4000 Å (0.4 μm) was formed on a substrate as a buffer layer, and a semiconductor layer having a thickness of 500 Å (0.05 μm) and including source and drain regions having a width of 4 μm and a length of 4 μm, and a channel region having a width of 4 μm and a length of 0.5 μm, was formed on the buffer layer. A silicon nitride layer having a thickness of 1200 Å (0.12 μm) was formed on the semiconductor layer as a gate insulating layer, and molybdenum having a thickness of 2000 Å (0.2 μm) was formed on the gate insulating layer as a gate electrode. A silicon nitride layer having a thickness of 1500 Å (0.15 μm) was formed on the entire surface of the substrate including the gate electrode as an interlayer insulating layer, and aluminum having a thickness of 1000 Å (0.1 μm) was formed on the interlayer insulating layer as source and drain electrodes respectively connected to the source and drain regions.

Comparative Example 2

A silicon nitride layer having a thickness of 4000 Å (0.4 μm) was formed on a substrate as a buffer layer, and a semiconductor layer having a thickness of 500 Å (0.05 μm) and including source and drain regions having a width of 4 μm and a length of 4 μm, LDD regions having a width of 4 μm and a length of 2 μm, and a channel region having a width of 4 μm and a length of 0.5 μm, was formed on the buffer layer. A silicon nitride layer having a thickness of 1200 Å (0.12 μm) was formed on the semiconductor layer as a gate insulating layer, and molybdenum having a thickness of 2000 Å (0.2 μm) was formed on the gate insulating layer as a gate electrode. A silicon nitride layer having a thickness of 1500 Å (0.15 μm) was formed on the entire surface of the substrate including the gate electrode as an interlayer insulating layer, and aluminum having a thickness of 1000 Å (0.1 μm) was formed on the interlayer insulating layer as source and drain electrodes respectively connected to the source and drain regions.

Table 1 shows the comparison result of resistance values of source and drain regions, sums of resistance values of source and drain regions and LDD regions, or sums of resistance values of source and drain regions and high resistance regions of Exemplary Embodiments 1, 2, 3, 4, 5 and 6, and Comparative Examples 1 and 2.

TABLE 1

| | Resistance value (Ω) |
|---|---|
| Exemplary Embodiment 1 | 10,551.72 |
| Exemplary Embodiment 2 | 14,551.72 |
| Exemplary Embodiment 3 | 18,551.72 |
| Exemplary Embodiment 4 | 22,551.72 |
| Exemplary Embodiment 5 | 26,551.72 |
| Exemplary Embodiment 6 | 30,551.72 |
| Comparative Example 1 | 40,551.72 |
| Comparative Example 2 | 42,051.72 |

Referring to Table 1, it will be appreciated that as the length of the high resistance region increases, the resistance values sequentially increase. In addition, comparing Comparative Example 1 with Exemplary Embodiments 1, 2, 3, 4, 5 and 6, it will be appreciated that the resistance values are significantly increased when the high resistance regions are included. Further, comparing Comparative Example 2 with Exemplary Embodiments 1, 2, 3, 4, 5 and 6, it will be appreciated that, while the smaller the length of the high resistance regions, the larger the difference between the resistance values, the longer the length of the high resistance regions, the smaller the difference between the resistance values.

Figure 5:
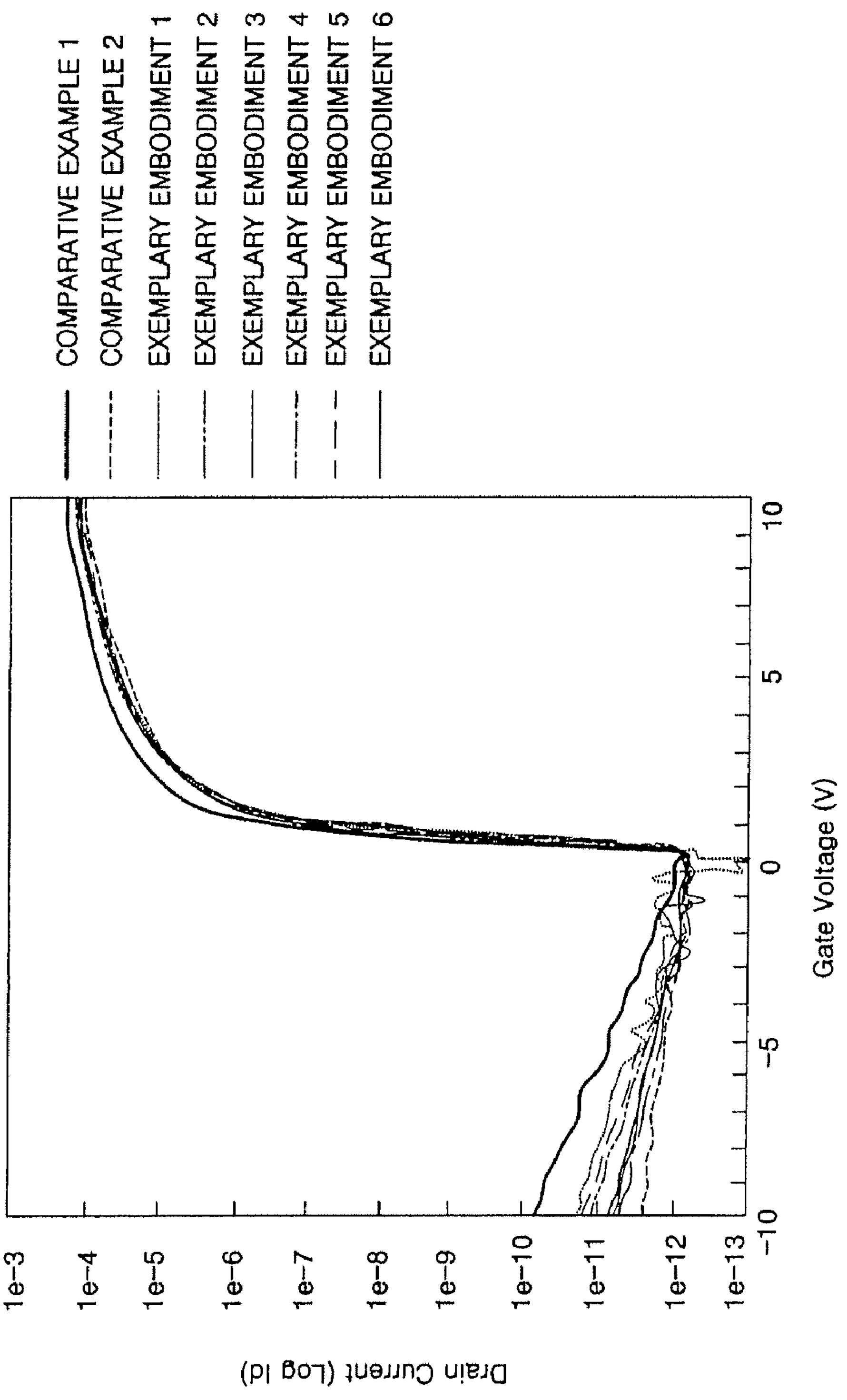
FIG. 5 is a graph schematically showing the relationship between drain current and gate voltage in Exemplary Embodiments 1, 2, 3, 4, 5 and 6, and Comparative Examples 1 and 2.
Figure 4A:
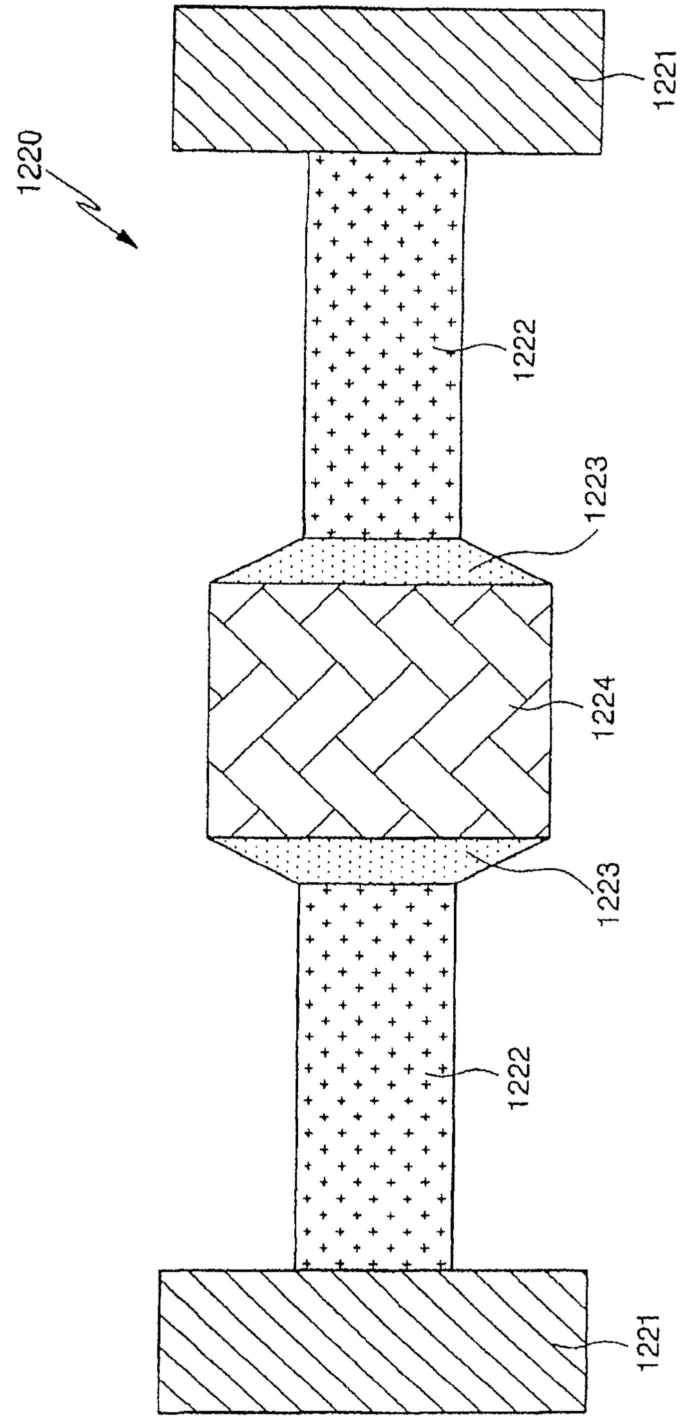
Figure 4B:
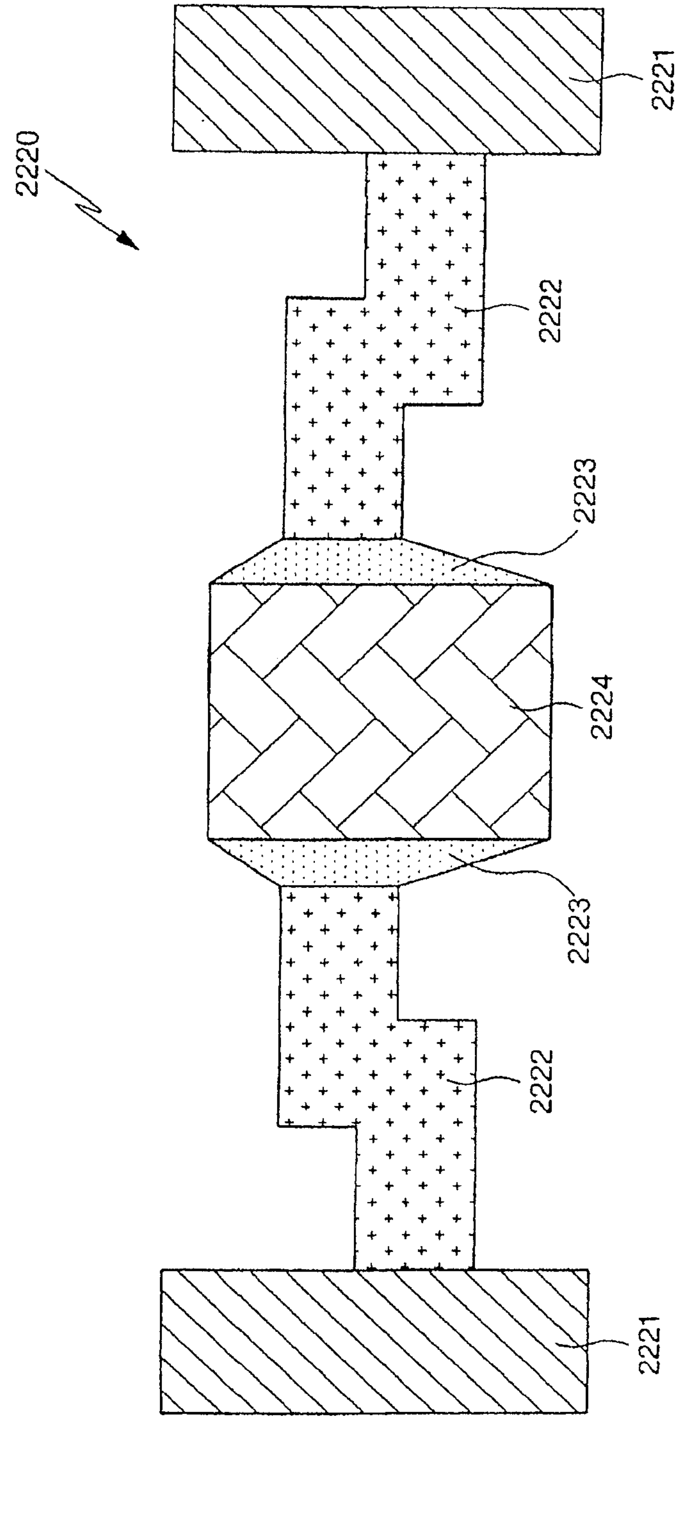

FIG. 5 is a graph schematically showing the relationship between drain current and gate voltage in Exemplary Embodiments 1, 2, 3, 4, 5 and 6, and Comparative Examples 1 and 2. An X-axis represents a gate voltage (V), and a Y-axis represents a drain current Id (A).

Referring to FIG. 5, in leakage currents of Exemplary Embodiments 1, 2, 3, 4, 5 and 6, when a gate voltage is 0V, a drain current is about 1e-12 A, and when a gate voltage is −10V, a drain current is about 1e-11 A. In addition, in Comparative Example 1, when a gate voltage is 0V, a drain current is about 1e-12 A, and when a gate voltage is −10V, a drain current is abruptly increased to about 1e-10 A. Further, in Comparative Example 2, when a gate voltage is −10 to 0V, a drain current is within a range of about 1e-11.8 to 1e-12 A.

As described above, while the leakage currents of Exemplary Embodiments 1, 2, 3, 4, 5 and 6 are decreased in comparison with Comparative Example 1, the leakage currents are increased in comparison with Comparative Example 2. In addition, the larger the length of the high resistance regions, the smaller the leakage current.

The thin film transistor in accordance with an exemplary embodiment of the present invention includes source and drain regions and high resistance regions. The high resistance regions have different sizes from the source and drain regions. The source and drain regions and the high resistance regions are formed through a single doping process. As a result, it is possible to reduce the number of masks and to simplify the process.

As can be seen from the foregoing, exemplary embodiments of the present invention provide a thin film transistor, a method of fabricating the same, and a flat panel display device including the same, including source and drain regions and high resistance regions. The high resistance regions have different sizes from the source and drain regions. The source and drain regions and the high resistance regions are formed through a single doping process. As a result, it is possible to reduce the number of masks and to simplify the process.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A thin film transistor comprising:

a substrate;

a semiconductor layer on the substrate and comprising source and drain regions, high resistance regions having a smaller width and a longer length than the source and drain regions, a channel region, and connection regions between respective said high resistance regions and the channel region;

a gate insulating layer on the semiconductor layer;

a gate electrode on the gate insulating layer above the channel region;

an interlayer insulating layer on the gate electrode; and source and drain electrodes on the interlayer insulating layer and electrically connected to the source and drain regions, respectively, wherein one of the high resistance regions is between the channel region and the source region, and another one of the high resistance regions is between the channel region and the drain region, and wherein the length of each of the high resistance regions is taken along a path of the high resistance region between the respective connection region and the respective source or drain region.

2. The thin film transistor according to claim 1, wherein the high resistance regions have a length that is 1.3-10 times larger than that of the source and drain regions.

3. The thin film transistor according to claim 2, wherein the high resistance regions have a length of 3-20 μm.

4. The thin film transistor according to claim 1, wherein the high resistance regions have a width that is 25-100% of a width of the source and drain regions.

5. The thin film transistor according to claim 4, wherein the width of the high resistance regions is 1-4 μm.

6. The thin film transistor according to claim 1, wherein the high resistance regions have a rectangular shape or a zigzag shape.

7. The thin film transistor according to claim 1, wherein the connection regions have an area that is 5-50% of an area of the channel region.

8. The thin film transistor according to claim 1, wherein the connection regions have at least one tapered angle.

9. The thin film transistor according to claim 1, wherein the connection regions have at least one curved surface.

10. A flat panel display device comprising:

a substrate;

a semiconductor layer on the substrate and comprising source and drain regions, high resistance regions having a smaller width and a longer length than the source and drain regions, a channel region, and connection regions between respective said high resistance regions and the channel region;

a gate insulating layer on the semiconductor layer;

a gate electrode on the gate insulating layer above the channel region;

an interlayer insulating layer on the gate electrode;

source and drain electrodes on the interlayer insulating layer and electrically connected to the source and drain regions, respectively; and a display element coupled with the source electrode or the drain electrode, wherein the display element is adapted to display an image in accordance with voltages applied at the gate electrode and the source and drain electrodes, wherein one of the high resistance regions is between the channel region and the source region, and another one of the high resistance regions is between the channel region and the drain region, and wherein the length of each of the high resistance regions is taken along a path of the high resistance region between the respective connection region and the respective source or drain region.

11. The flat panel display device according to claim 10, wherein the high resistance regions have a length of 1.3-10 times larger than that of the source and drain regions.

12. The flat panel display device according to claim 11, wherein the high resistance regions have a length of 3-20 μm.

13. The flat panel display device according to claim 10, wherein the high resistance regions have a width that is 25-100% of a width of the source and drain regions.

14. The flat panel display device according to claim 13, wherein the width of the high resistance regions is 1-4 μm.

15. The flat panel display device according to claim 10, wherein the high resistance regions have a rectangular shape or a zigzag shape.

16. The flat panel display device according to claim 10, wherein the connection regions have an area that is 5-50% of an area the channel region.

17. The flat panel display device according to claim 10, wherein the connection regions have at least one tapered angle.

18. The flat panel display device according to claim 10, wherein the connection regions have at least one curved surface.

19. A thin film transistor comprising:

a substrate;

a semiconductor layer on the substrate and comprising source and drain regions, high resistance regions having a smaller width or a longer length than the source and drain regions, a channel region, and connection regions between respective said high resistance regions and the channel region;

a gate insulating layer on the semiconductor layer;

a gate electrode on the gate insulating layer above the channel region;

an interlayer insulating layer on the gate electrode; and source and drain electrodes on the interlayer insulating layer and electrically connected to the source and drain regions, respectively, wherein one of the high resistance regions is between the channel region and the source region, and another one of the high resistance regions is between the channel region and the drain region, wherein the length of each of the high resistance regions is taken along a path of the high resistance region between the respective connection region and the respective source or drain region, wherein the high resistance regions and the source and drain regions have substantially a same dopant concentration, and wherein the width and length of the high resistance regions are chosen with respect to those of the source and drain regions so that the high resistance regions have higher resistance than that of the source and drain regions.

* * * * *

UNITED STATES PATENT AND TRADEMARK OFFICE

CERTIFICATE OF CORRECTION

PATENT NO. : 7,821,007 B2
APPLICATION NO. : 11/971191
DATED : October 26, 2010
INVENTOR(S) : Choi It is certified that error appears in the above-identified patent and that said Letters Patent is hereby corrected as shown below:

Delete figs. 4A and 4B and substitute therefor the drawing sheet, consisting of figs. 4A and 4B as shown on the attached pages.

Signed and Sealed this
Seventh Day of February, 2012

David J. Kappos

*Director of the United States Patent and Trademark Office*